United States Patent
Rink et al.

(10) Patent No.: US 9,746,503 B2
(45) Date of Patent: Aug. 29, 2017

(54) METHOD FOR ADJUSTING A CURRENT SENSOR

(71) Applicant: Continental Teves AG & Co. oHG, Frankfurt (DE)

(72) Inventors: Klaus Rink, Rodenbach (DE); Wolfgang Jöckel, Gersfeld (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 219 days.

(21) Appl. No.: 14/652,928

(22) PCT Filed: Nov. 22, 2013

(86) PCT No.: PCT/EP2013/074524
§ 371 (c)(1),
(2) Date: Jun. 17, 2015

(87) PCT Pub. No.: WO2014/095227
PCT Pub. Date: Jun. 26, 2014

(65) Prior Publication Data
US 2015/0323607 A1   Nov. 12, 2015

(30) Foreign Application Priority Data

Dec. 20, 2012   (DE) .................. 10 2012 224 105

(51) Int. Cl.
*G01R 27/08* (2006.01)
*G01R 27/00* (2006.01)
(Continued)

(52) U.S. Cl.
CPC ......... *G01R 19/0092* (2013.01); *G01R 31/36* (2013.01); *G01R 27/02* (2013.01); *G01R 35/005* (2013.01)

(58) Field of Classification Search
CPC .............. G01R 31/361; G01R 31/3675; G01R 19/0092; G01R 35/005; G01R 31/36; G01R 27/02
(Continued)

(56) References Cited

U.S. PATENT DOCUMENTS

2009/0140749 A1   6/2009  Spah
2013/0169297 A1   7/2013  Pilz
(Continued)

FOREIGN PATENT DOCUMENTS

DE   102007058314   6/2009
DE   102011078548   1/2012
(Continued)

OTHER PUBLICATIONS

German Search Report for German Application No. 10 2012 224 105.1 mailed Aug. 6, 2013, including partial translation.
(Continued)

*Primary Examiner* — Amy He
(74) *Attorney, Agent, or Firm* — RatnerPrestia

(57) ABSTRACT

A method for adjusting a current sensor with a measuring element having a broken rational current-voltage characteristic curve, including:—changing the broken rational profile of the broken rational current-voltage characteristic curve of the measuring element on the basis of at least one predetermined condition.

9 Claims, 3 Drawing Sheets

(51) Int. Cl.
  *G01R 19/00* (2006.01)
  *G01R 31/36* (2006.01)
  *G01R 27/02* (2006.01)
  *G01R 35/00* (2006.01)

(58) Field of Classification Search
  USPC .................................. 324/426, 600, 713
  See application file for complete search history.

(56) References Cited

U.S. PATENT DOCUMENTS

2013/0181723 A1* 7/2013 Mauder .............. G01R 19/0092
  324/601
2013/0214804 A1 8/2013 Dietz

FOREIGN PATENT DOCUMENTS

EP    2068158     6/2009
WO    2011113939  9/2011

OTHER PUBLICATIONS

International Search Report for International Application No. PCT/EP2013/074524 mailed Feb. 13, 2014.

* cited by examiner

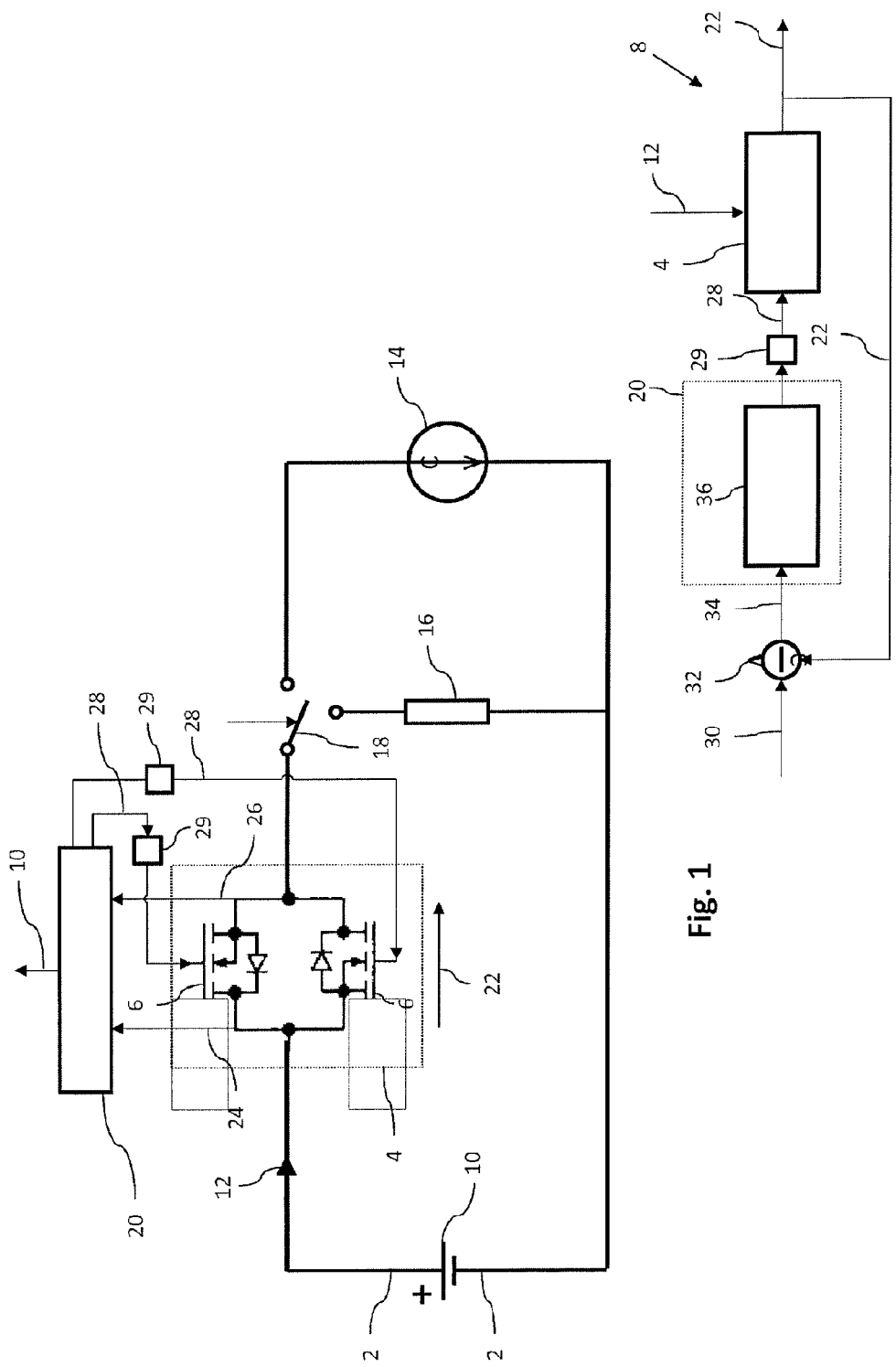

METHOD FOR ADJUSTING A CURRENT SENSOR

CROSS REFERENCE TO RELATED APPLICATIONS

This application is the U.S. National Phase Application of PCT International Application No. PCT/EP2013/074524, filed Nov. 22, 2013, which claims priority to German Patent Application No. 10 2012 224 105.1, filed Dec. 20, 2012, the contents of such applications being incorporated by reference herein.

FIELD OF THE INVENTION

The invention relates to a method for adjusting a current sensor having a measuring element that comprises a broken rational current-voltage characteristic curve, the invention also relates to a control device for implementing the method and a current sensor having the control device.

BACKGROUND OF THE INVENTION

It is possible to connect a current sensor in series between the electrical energy source and the electrical consumer so as to perform measurements of an electrical current that flows between an electrical energy source and an electrical energy consumer in a motor vehicle. A current sensor of this type is disclosed by way of example in DE 10 2011 078 548 A1, which is incorporated by reference.

SUMMARY OF THE INVENTION

An aspect of the present invention is to improve current measurement.

In accordance with one aspect of the invention, a method for adjusting a current sensor having a measuring element that comprises a broken rational current-voltage characteristic curve comprises the step of changing the broken rational profile of the broken rational current-voltage characteristic curve of the measuring element based upon at least one predetermined requirement.

The statement "a measuring element that comprises a broken rational current-voltage characteristic curve" is to be understood within the scope of the disclosed method to mean an electrical component at which a drop in voltage in the broken rational manner depends on the current that flows through said component. In contrast to an ohmic resistor, it is therefore necessary for the current that flows through the component therefore to be exponentiated with an arbitrary negative exponent in order to mathematically describe the measuring element.

The statement "a change in the broken rational profile of the broken rational current-voltage characteristic curve of the measuring element based on at least one predetermined requirement" is deemed within the scope of the disclosed method to include both a change in another broken rational profile as well as a change in a non-broken rational profile.

The consideration regarding the disclosed method is based on the current sensor that is mentioned in the introduction, said current sensor comprising a measuring element and a closed-loop control circuit that maintains a voltage drop at the measuring element as constant by way of the current that is to be measured. Using this constant voltage drop, it is possible for the electrical current to be determined by means of the measuring element itself in the case of small currents in an error-free manner.

However, within the scope of this consideration it is recognised that the control process imposes the above mentioned broken rational current-voltage characteristic curve on the measuring element, said broken rational current-voltage characteristic curve in the ideal case comprising a root-shaped curve. The broken rational profile can nevertheless be embodied with an arbitrary above mentioned negative exponent. By means of the broken rational, in the ideal case broken root-shaped, characteristic curve of the measuring element, the actually quadratic dependency between the electrical power that is consumed by the measuring element and the electrical current is linearized by means of the measuring element. However, as a result of this linear dependency between the electrical current and the power consumption at the measuring element, the measuring element consumes more electrical power compared to a pure ohmic resistor, wherein the electrical current depends in a quadratic manner on the power consumption.

The approach of the disclosed method within its scope proposes the changing of the broken rational current-voltage characteristic curve in dependence upon the situation. This can be achieved by way of example by means of an adjustment of various parameters of the above mentioned closed-loop control circuit. Examples of this are disclosed in the dependent claims.

In order to minimize the above mentioned electrical power consumption, it is possible to change the broken rational current-voltage characteristic curve by way of example by means of adjusting the closed-loop control circuit in such a manner that the measured current is determined at each measuring point using a signal/noise ratio, wherein a reliable evaluation of the current that is to be measured is guaranteed. In this manner, the power consumption is reduced to a minimum without the possibility of having to accept inaccuracies in the measurement result. The above mentioned, predetermined requirement could be defined for the change in the broken rational profile of the current-voltage characteristic curve of the current sensor and consequently the situation-dependent change of the current-voltage characteristic curve of the measurement could thus be defined by the measured current itself.

In a surprising manner, the situation-dependent, changed current-voltage characteristic curve of the measuring element also renders it possible to counteract other errors in the measurement. By way of example, as a result of a temperature-dependent and/or moisture-dependent changed current-voltage characteristic curve of the measuring element, it is possible to compensate accordingly for temperature-dependent and/or moisture-dependent measurement errors. Accordingly, a plurality of further influences on the current measurement could be counteracted by means of a corresponding change of the current-voltage characteristic curve of the measuring element.

With the situation-dependent change of the broken rational current-voltage characteristic curve for the measuring element, the quality of a measurement result of the current sensor having the measuring element can therefore be increased.

In a further development of the disclosed method, the broken rational current-voltage characteristic curve of the measuring element can be adjusted based upon a control signal by means of correcting an actual voltage drop at the measuring element to a desired voltage drop, said actual voltage drop being dependent upon a resistance value and an electrical current that is to be measured. Although a measuring element having a broken rational current-voltage characteristic curve could theoretically also be converted in any arbitrary manner, the implementation by way of the above mentioned closed-loop control circuit can however be achieved in practice in this manner most efficiently in an electrical circuit. In principle, any classic active and passive resistor that can be influenced by way of a control signal can be selected as the measuring element. Examples of this would be adjustable ohmic resistors or transistors, such as bipolar transistors or field effect transistors.

In an additional further development, the disclosed method comprises the step of changing the broken rational profile of the broken rational current-voltage characteristic curve of the measuring element by means of adjusting the desired voltage drop in accordance with a physical variable. In other words, it is not necessary to maintain the voltage drop as constant at the measuring element of the current sensor, rather said voltage drop could be adjusted to suit the above mentioned situations that are dependent upon specific physical variables. By way of example, if a reference voltage resistance value of the measuring element changes as a result of physical variables such as moisture, contamination or temperatures, the changed reference resistance value would thus accordingly lead to a change in the curve of the broken rational current-voltage characteristic curve that is generated using the closed-loop control circuit. This change in the profile then accordingly causes errors in the intended current measurement. With the disclosed further development, the change in the profile of the broken rational current-voltage characteristic curve is corrected by way of a corresponding change in the desired voltage drop and thus the corresponding measurement error is compensated for.

The physical variable itself can be arbitrary. By way of example, it is possible in a non-limiting manner for said variable to be a temperature, the electrical current, a measurement range of the electrical current and/or the actual voltage drop.

In an alternative further development, the disclosed method comprises the step of changing the broken rational current-voltage characteristic curve by means of influencing the control signal independently of the closed-loop control process. In this manner, an alternative or additional influencing variable is made available with which the broken rational current-voltage characteristic curve of the measuring element that is generated by means of the closed-loop control circuit can be changed.

In a particular further development of the disclosed method, the control signal is maintained as constant so as to influence the control signal so that the resistance value of the measuring element remains constant. In other words, the closed-loop control circuit is interrupted and the broken rational current-voltage characteristic curve of the measuring element is consequently changed into a conventional linear current-voltage characteristic curve such as at an ohmic resistor. Although the above mentioned problem of the poor measurement result for comparatively small electrical currents that are to be measured would arise in this manner, in the case of high electrical currents that are to be measured, it is possible however to reduce the power consumption of the current sensor.

In a particularly preferred further development of the disclosed method, the control signal is maintained as constant if the electrical current exceeds a predetermined value. In detail, the further development proposes to activate the broken rational current-voltage characteristic curve of the measuring element only in those measurement ranges of the electrical current that is to be measured in which the measurement results are too imprecise as a result of the quadratic curve of the above mentioned uncontrolled classic active or passive resistor. Above a specific magnitude of the current that is to be measured, above which the electrical current can also be determined in a sufficiently precise manner with an uncontrolled and therefore by way of example classic ohmic resistor, the advantages of the low power consumption of the classic ohmic resistor can be utilized.

In yet another further development of the disclosed method, the process of influencing the control signal comprises a process of closed-loop control of the control signal in response to a physical variable that is different from the actual voltage drop. In other words, a further closed-loop control circuit can be subordinate to or higher ranking than the closed-loop control circuit so as to generate the broken rational current-voltage characteristic curve of the measuring element, and with said further closed-loop control circuit the above mentioned error influences such as temperature, moisture and/or contamination can be corrected in order to further increase the precision of the measurement result.

In accordance with a further aspect of the invention, a control device is equipped to implement a method in accordance with any one of the preceding claims.

In a further development of the disclosed control device, the disclosed device comprises a memory device and a processor. The disclosed method is stored in the memory device in the form of a computer program and the processor is provided so as to implement the method if the computer program is loaded from the memory device into the processor.

In accordance with a further aspect of the invention, a computer program comprises programming code means in order to implement all the steps of one of the disclosed methods if the computer program is implemented on a computer or on one of the disclosed devices.

In accordance with a further aspect of the invention, a computer program product comprises a program code that is stored on a data carrier that can be read by a computer and said program code performs one of the disclosed methods if the program code is implemented on a data processing device.

BRIEF DESCRIPTION OF THE DRAWINGS

The above described characteristics, features and advantages of this invention and also the manner in which these are achieved are more clearly and explicitly described in connection with the following description of the exemplary embodiments that are further explained in connection with the drawings, wherein:

FIG. 1 illustrates a schematic view of a vehicle battery circuit that is connected to a vehicle battery terminal and comprises two current sensors, FIG. 2 illustrates a schematic view of a closed-loop control circuit for controlling the current sensor in FIG. 1.

DETAILED DESCRIPTION OF THE PREFERRED EMBODIMENTS

Figure 3:
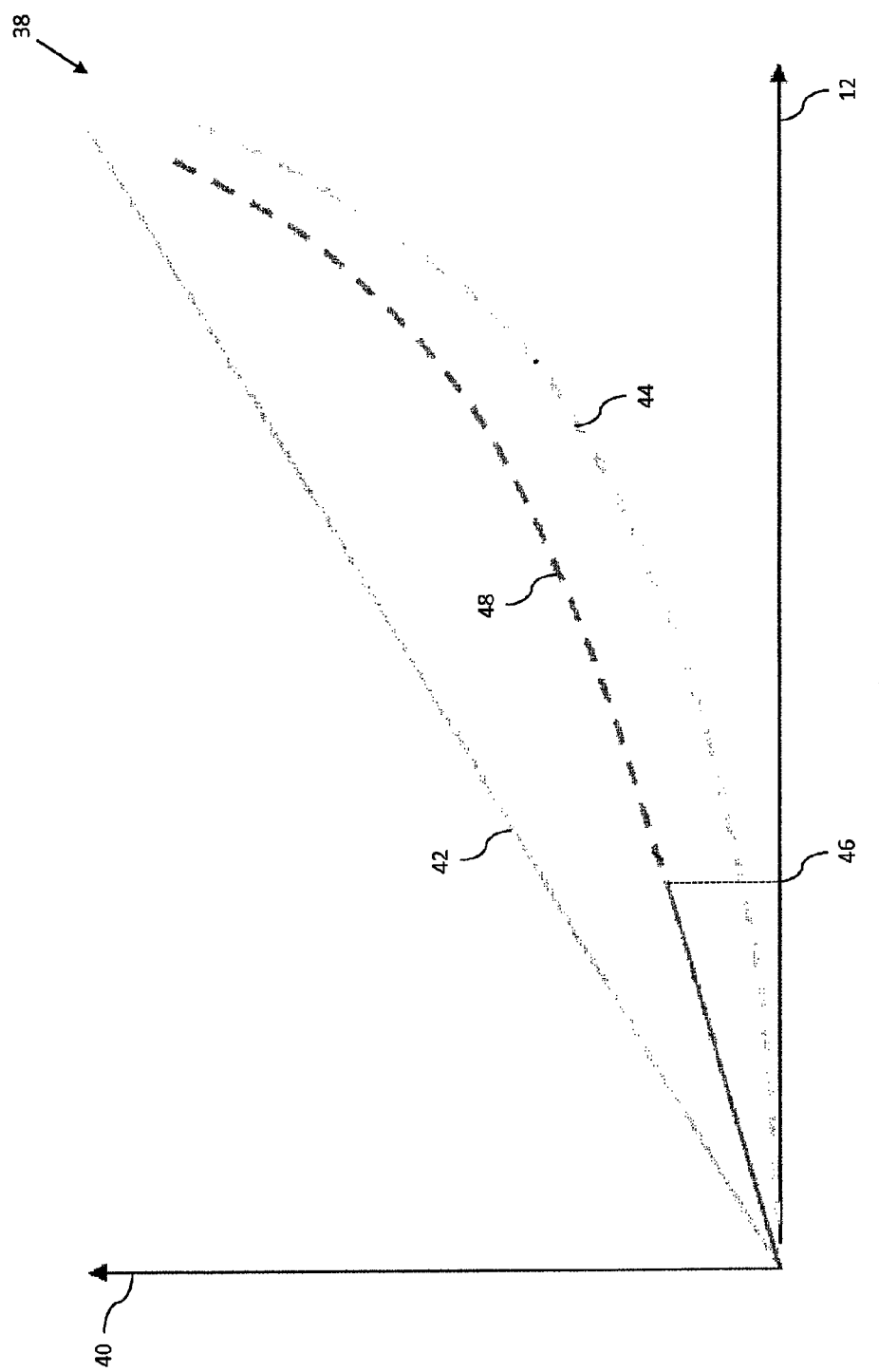
FIG. 3 illustrates a graph, in which a current that is to be measured is compared to a power consumption of a resistor and the current that is to be measured flows through said resistor.

In the figures, identical technical elements are provided with identical reference numerals and are only described once.

Reference is made to FIG. 1 and FIG. 2 that illustrate accordingly a schematic view of a vehicle battery circuit 4 that is connected to a vehicle battery terminal 2 and comprises two current sensors 6 and a schematic view of a closed-loop control circuit 8 for controlling the current sensors 6 in FIG. 1.

The vehicle battery terminal 2 is one of two vehicle battery terminals 2 of a vehicle battery 10. An electrical current 12 from an electrical energy source 14, such as by way of example a plug socket, can be received or can be output to an electrical consumer 16, such as by way of example a drive motor of a vehicle that is not further illustrated by way of the vehicle battery terminal 2 and the vehicle battery circuit 4 that is connected to the vehicle battery terminals 2.

In order to negate the need for the electrical consumer 16 to be directly connected to the electrical energy source 14, the electrical energy source 14 and the electrical consumer 16 can be additionally electrically separated from one another by way of a double throw switch 18 so that in dependence upon the position of the double throw switch 18 either the electrical energy source 14 or the electrical consumer 16 is connected to the vehicle battery 10.

The vehicle battery circuit 4 having the current sensors 6 can be constructed in accordance with the active shunt that is disclosed in DE 10 2011 078 548 A1. For this purpose, each current sensor 6 in the present embodiment comprises a field effect transistor that is not further referenced and a free-wheeling diode that is not further referenced and that is connected in the through-flow direction from source to drain. The two current sensors 6 are connected to one another in an antiparallel manner with respect to the vehicle battery circuit 4.

In addition, an evaluating circuit 20 is illustrated in FIG. 1. The evaluating circuit 20 can be part of the vehicle battery circuit 4 or embodied as a separate circuit. In the present embodiment, the vehicle battery circuit 4 is embodied in an exemplary manner as separate from the evaluating circuit 20.

In the present embodiment, the evaluating circuit 20 controls the field effect transistors of the current sensors 6 in such a manner that a voltage drop 22 across the current sensors is maintained at a specific desired value. For this purpose, the evaluating circuit 20 receives a first electrical potential 24 that is tapped upstream of the current sensors 6 as seen from the vehicle battery 10 and a second electrical potential 26 that is tapped downstream of the current sensors 6 as seen from the vehicle battery 10. The voltage drop 22 is determined as the difference between the first electrical potential 24 and the second electrical potential 26.

The voltage drop 22 across the closed-loop control circuit 8 that is illustrated in FIG. 2 is maintained at the desired value 30 by means of controlling the gates of the field effect transistors of the current sensors 6 in each case with a control signal 28 for the current sensors 6. The control signals 28 are, as is illustrated in DE 10 2011 078 548 A1, dependent upon the electrical current that is to be measured 12. It is therefore possible, if this dependency is stored in the evaluating circuit 20, for the electrical current 12 to be derived directly from the control signals 28. In the present embodiment, it is possible to limit the control signals to a specific value by way of a limiter 29 that is yet to be described.

In the present embodiment, the closed-loop control circuit 8 comprises the vehicle battery circuit 4 as a closed-loop control circuit and said vehicle battery circuit is controlled by way of the control signals 28 in the above described manner so that the voltage drop 22 can be tapped across the current sensors 6 of the vehicle battery circuit 4. This voltage drop 22 is compared at a comparison point 32 to the desired value 30 by means of subtraction, wherein a controlling difference 34 occurs that is output to a controller 36 that is arranged in the evaluating circuit 20 and is known to the person skilled in the art. The controller 36 then in turn generates the control signals 28 in order to maintain the voltage drop 22 at the desired value 30.

Further details of the current sensors 6 or respectively their evaluating unit 20 are evident in the previously mentioned DE 10 2011 078 548 A1.

Reference is made to FIG. 3 having a graph 38, wherein the current that is to be measured 12 of a power consumption 40 is compared to one of the current sensors 6 through which the current that is to be measured 12 flows.

A straight line 42 is illustrated in FIG. 3 by a continuous line and said straight line illustrates the power consumption 40 of the current sensor 6 if the control signal 28 could assume any high value, and therefore would be independent of the limiter 29. In this case, the power consumption 40 of the current sensor 6 would be linear across the entire value range of the current that is to be measured 12.

In contrast, a parabola 44 is illustrated in FIG. 3 by a dashed line and said parabola would illustrate the power consumption 40 of the current sensor 6 if said current sensor were to be embodied as an uncontrolled passive resistor.

It is clear from FIG. 3 that the current that is to be measured 12 causes few changes in the power consumption 40 of the passive resistor in a lower value range. Accordingly, in the case of changes to the current that is to be measured 12 in this lower value range, few changes are determined in the voltage drop 22 with the passive resistor. This problem is encountered with the closed-loop control circuit 8 that is illustrated in FIG. 1 and said closed-loop control circuit linearizes the power consumption 40 of the current sensor 6 and also renders possible precise measurement results in the lower measurement range of the current that is to be measured 12.

However, as is likewise evident in FIG. 3, the straight line 42 extends above the parabola 44 which means that the power consumption 40 of the current sensor 6 in the case of being controlled with the closed-loop control circuit 8 is noticeably higher than if a passive resistor were to be used.

This high power consumption 40 is countered by the limiter 29, wherein the current sensor 6 is only controlled up to a specific maximal current 46 with the closed-loop control circuit 8. Above this maximal current 46, the limiter 29 interrupts the closed-loop control circuit and the current sensor 6 functions as a conventional passive resistor. In this manner, the process of determining in a precise manner the current that is to be measured can be combined with the controlled current sensor 6 in the lower value range and the low power consumption 40 of a passive resistor in higher value ranges of the current that is to be measured.

The limiter therefore combines the straight line 42 and the parabola 44 to form a combination characteristic curve 48 for the current sensor 6.

Figure 4:
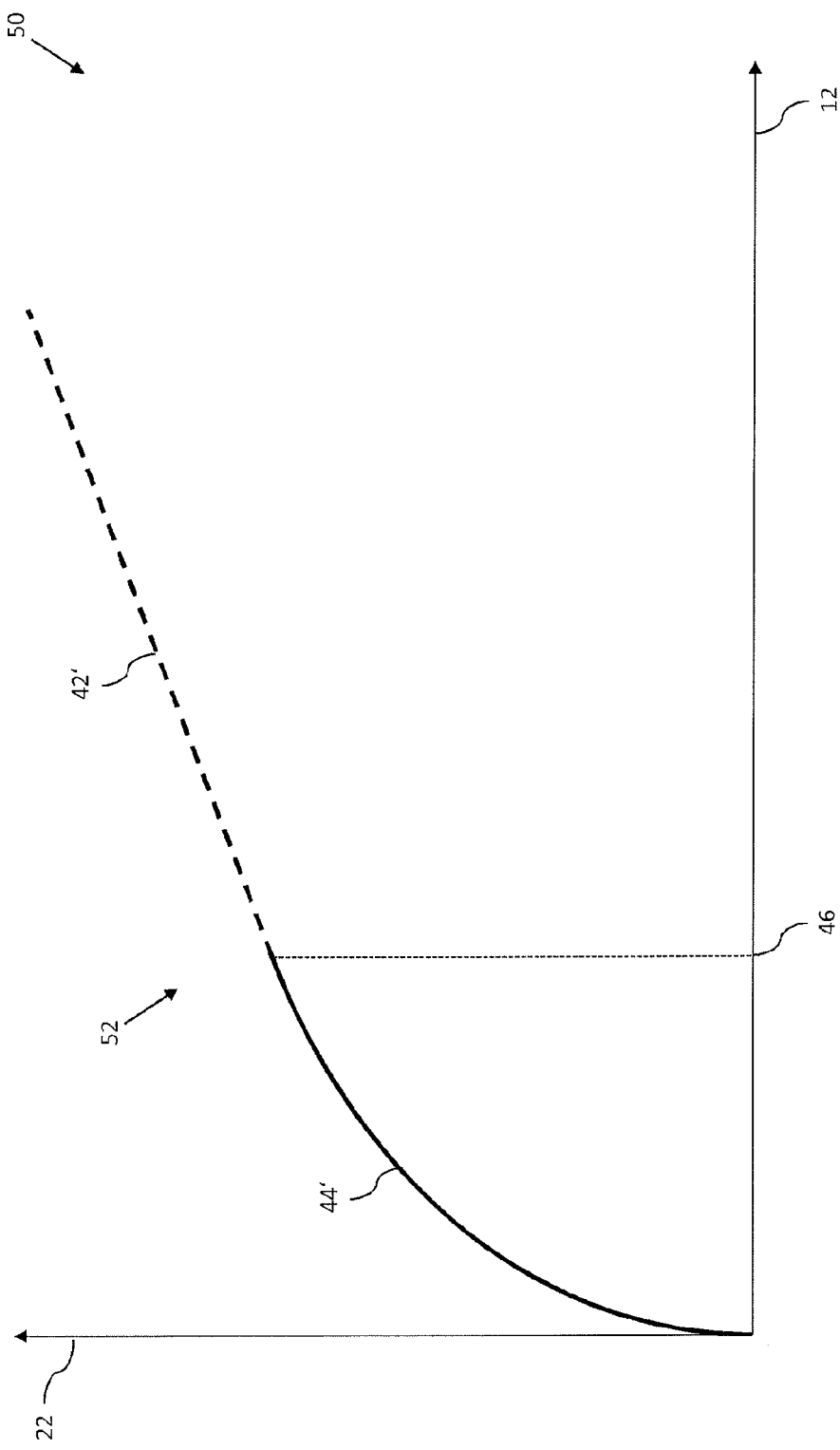
FIG. 4 illustrates a diagram of a current-voltage characteristic curve of a resistor in a current sensor of FIG. 1.

Reference is made to a diagram 50 in FIG. 4, wherein the current that is to be measured 12 is compared to the voltage drop 22 at the current sensor 6 that has been discussed earlier within the scope of FIG. 3, and the current that is to be measured 12 flows through said current sensor. In other words, the current-voltage characteristic curve 52 of this current sensor 6 is illustrated in FIG. 4.

As is evident in FIG. 4, the current-voltage characteristic curve 52 extends in a lower part range 44' up to the above mentioned maximal current 46 broken rational, in detail broken root-shaped. The broken rational profile is determined by means of the closed-loop control circuit 8. Above the maximal current 46, the closed-loop control circuit 8 is rendered ineffective by means of the limiter 29 and the current sensor 6 behaves in an upper part range 42' like a linear resistor.

The limitation by means of the limiter 28 can be performed based on the empirical values for the control signal 28. However, in a non-illustrated manner, the limitation can also occur based on the current that is to measured 12 in such a manner that the limiter is activated above a specific value of the current that is to be measured 12.

The invention claimed is:

1. A method for adjusting at least two current sensors of a vehicle battery circuit, the current sensors having a measuring element that comprises a broken rational current-voltage characteristic curve, said method comprising:
   correcting an actual voltage drop across the current sensors that is dependent upon a resistance value and an electrical current that is to be measured; and
   changing a broken rational profile of the broken rational current-voltage characteristic curve of the measuring element based upon a control signal,
   wherein the at least two current sensors each include a field effect transistor and a free-wheeling diode,
   wherein the at least two current sensors are connected in antiparallel with respect to each other and the vehicle battery circuit.

2. The method as claimed in claim 1, further comprising changing the broken rational profile of the broken rational current-voltage characteristic curve of the measuring element by adjusting the desired voltage drop in accordance with a physical variable.

3. The method as claimed in claim 2, wherein the physical variable is at least one of a temperature, the electrical current, a measurement range of the electrical current and the actual voltage drop.

4. The method as claimed in claim 1, further comprising deviating from the broken rational profile of the broken rational current-voltage characteristic curve by influencing the control signal independently of a closed-loop control process.

5. The method as claimed in claim 4, wherein the control signal is maintained as constant so as to influence the control signal so that the resistance value of the measuring element remains constant.

6. The method as claimed in claim 5, wherein the control signal is maintained as constant when the electrical current exceeds a predetermined value.

7. The method as claimed in claim 4, wherein influencing the control signal comprises a closed-loop control of the control signal in response to a physical variable that is different from the actual voltage drop.

8. A control device for adjusting at least two current sensors of a vehicle battery circuit, the current sensors having a measuring element that comprises a broken rational current-voltage characteristic curve, and a closed loop control circuit that maintains a voltage drop at the measuring element as constant,
   wherein the at least two current sensors each include a field effect transistor and a free-wheeling diode,
   wherein the at least two current sensors are connected in antiparallel with respect to each other and the vehicle battery circuit, and
   wherein the control device changes a broken rational profile of the broken rational current-voltage characteristic curve of the measuring element based upon at least one predetermined requirement.

9. The control device of claim 8, further comprising a limiter element connected to the current sensors to control signals supplied to the current sensors to a specific value.

* * * * *